United States Patent [19]
Choe et al.

[11] Patent Number: 5,721,548
[45] Date of Patent: Feb. 24, 1998

[54] ANALOG-TO-DIGITAL CONVERTER FOR COMPENSATING FOR INPUT BIAS CURRENT OF COMPARATOR

[75] Inventors: Myung-Jun Choe, Seoul; Byeong-Whee Yun, Kyungki-do, both of Rep. of Korea

[73] Assignee: Samsung Electronics Co., Ltd., Suwon, Rep. of Korea

[21] Appl. No.: 720,996

[22] Filed: Oct. 14, 1996

[30] Foreign Application Priority Data

Oct. 13, 1995 [KR] Rep. of Korea ............ 95-35262

[51] Int. Cl.$^6$ ............................................. H03M 1/10
[52] U.S. Cl. ............................ 341/118; 341/158; 341/159; 341/120
[58] Field of Search ........................... 341/118, 119, 341/120, 158, 159

[56] References Cited

U.S. PATENT DOCUMENTS

| | | | |
|---|---|---|---|
| 4,578,715 | 3/1986 | Yamaguchi | 358/283 |
| 4,990,917 | 2/1991 | Kohdaka | 341/159 |
| 5,070,332 | 12/1991 | Kaller et al. | 341/156 |
| 5,111,205 | 5/1992 | Morlon | 341/156 |
| 5,194,867 | 3/1993 | Fisher | 341/159 |
| 5,218,362 | 6/1993 | Mayes et al. | 341/121 |
| 5,376,937 | 12/1994 | Colleran et al. | 341/159 |
| 5,416,484 | 5/1995 | Lofstrom | 341/159 |
| 5,489,905 | 2/1996 | Gross | 341/160 |
| 5,534,864 | 7/1996 | Ono | 341/156 |

Primary Examiner—Jeffrey A. Gaffin
Assistant Examiner—Jason H. Vick
Attorney, Agent, or Firm—Marger, Johnson, McCollom & Stolowitz, P.C.

[57] ABSTRACT

An analog-to-digital converter includes a reference voltage generator for dividing a voltage between first and second reference voltages by a plurality of resistors serially connected therebetween and providing a plurality of reference voltages at each connecting point of the resistors; a plurality of emitter-coupled comparators for respectively generating a comparative signal by comparing the reference voltages with an analog input signal; and a plurality of constant current sources for respectively supplying an input bias current to each reference voltage input terminal of the emitter-coupled comparators.

14 Claims, 3 Drawing Sheets

ANALOG-TO-DIGITAL CONVERTER FOR COMPENSATING FOR INPUT BIAS CURRENT OF COMPARATOR

BACKGROUND OF THE INVENTION

1. Field of the Invention

The present invention relates to analog-to-digital converters, and more particularly to an analog-to-digital converter which compensates for an input bias current of a comparator.

2. Description of the Prior Art

A conventional analog-to-digital converter includes, as shown in FIG. 1, a reference voltage generator 10 having a string of resistors. A comparative circuit 20 includes a plurality of comparators $C(1); \ldots, C(2^N-1)$ for comparing a plurality of reference voltages $VR(1) \ldots, VR(2^N-1)$ generated from the reference voltage generator 10 with an analog input signal voltage Va. An encoder 30 encodes the outputs of the comparative circuit 20 and generating an N-bit digital signal. That is, the reference voltage generator 10 generates a plurality of reference voltages $VR(1), \ldots, VR(2^N-1)$ produced by the resistors $R(1), \ldots, R(2^N)$ to be connected to respective (−) terminals of the comparators $C(1) \ldots, C(2^N-1)$. These reference voltages are compared with the analog input signal voltage Va, and each comparator generates "1" or "0". The number of "1"s generated from the comparators is determined according to the analog input signal voltage. For example, if the analog input signal voltage has a value between VR(1) and VR(2), only the comparators C(1) generates "1" and the others generate "0". If the analog input signal voltage has a value between VR(2) and VR(3), the comparators C(1) and C(2) generate "1" and the others generate "0". The encoder 30 includes a logic circuit for obtaining a digital output value from the outputs of the comparators $C(1) \ldots, C(2^N-1)$. That is, the number of "1"s of the outputs of the comparators $C(1), \ldots, C(2^N-1)$ is counted in the encoder 30 and is converted to digital data.

Each time the analog input value exceeds one reference voltage value, the output of the analog-to-digital converter changes from one value to another value. In other words, if the analog input value is less than the reference voltage VR(3), the digital output of the analog-to-digital converter becomes binary digits "0010", and if it is greater than VR(3), the digital output becomes "0011". The reference voltages must be accurate to produce accurate conversions. For the output to be linear, the reference voltages must be linear. That is, each voltage difference between $VR(1), VR(2), \ldots,$ $VR(2^N-1)$ should be constant. However, as shown in FIG. 1, the conventional analog-to-digital converter having each reference voltage point connected to each comparator cannot ensure the linearity of the reference voltage due to an input bias current $i_b$ of the comparator.

FIG. 2 is an equivalent circuit diagram of the reference voltage generator 10 shown in FIG. 1. $VR(1), VR(2), \ldots,$ $VR(2^N-1), VR(2^N)$ are reference voltage points and are connected to the comparators. Assuming that $i_b$ is the input bias current of each comparator, $V_{FS}$ is a full scale value of the analog-to-digital converter, R is a resistance value of unit resistor constituting the string of resistors, and I(n) is a current flowing into n-th reference resistor then $$I(2^N-1) = I_{MIN} + i_b, \ldots,$$

$$I(2) = I_{MIN} + (2^N-2)i_b,$$

$$I(1) = I_{MIN} + (2^N-1)i_b \text{ and}$$

$$V_{FS} = I(1)R + I(2)R + \ldots + I(2^N)R$$

Therefore, $$V_{FS} = I_{MIN}R + (I_{MIN}+i_b)R + \ldots + \{I_{MIN}+i_b(2^N-1)\}R$$

$$= \sum_{k=1}^{2^N} \{I_{MIN}+i_b(2^N-k)\}R$$

Since the accurate nth voltage value of the analog-to-digital converter is $|V_n|=n/2^N \cdot V_{FS}$, a voltage value VR(n) appearing at each reference point is as follows:

$$|VR(n)| = \{I_{MIN}+(2^N-1)i_b\}R + \{I_{MIN}+(2^N-2)i_b\}R + \ldots +$$
$$\{I_{MIN}+(2^N-n)i_b\}R$$

$$= \sum_{k=1}^{n} \{I_{MIN}+(2^N-k)i_b\}R$$

A difference between the ideal value $V_n$ and the actual value VR(n) is given by:

$$\Delta V(n) = |(|VR(n)| - |V_n|)|$$

$$= \sum_{k=1}^{n} \{I_{MIN}+(2^N-k)i_b\}R - \frac{n}{2^N} \sum_{k=1}^{2^N} \{I_{MIN}+(2^N-k)i_b\}R$$

$$= R\left[ \left\{ nI_{MIN} + 2^N i_b n - \frac{n(n+1)}{2} i_b \right\} - \right.$$

$$\left. \frac{n}{2^N} \left\{ 2^N I_{MIN} + 2^N i_b 2^N + \frac{2^N(2^N+1)}{2} i_b \right\} \right]$$

$$= R\left\{ nI_{MIN} + n2^N i_b - \frac{n(n+1)}{2} i_b - nI_{MIN} - n2^N i_b + n\frac{2^N+1}{2} i_b \right\}$$

$$= \frac{n i_b R}{2} \{(2^N+1) - (n+1)\}$$

$$= \frac{n i_b R}{2} (2^N - n)$$

FIG. 3 is a graph of the reference voltage characteristic using the above equations and FIG. 4 is a graph illustrating the resulting error in the reference voltage. In FIG. 3, a dotted line shows the ideal reference voltage and a solid line shows the actual reference voltage.

As shown in FIGS. 3 and 4, the reference voltage of the analog-to-digital converter has an error due to the input bias current of the comparator. The conversion characteristic of the analog-to-digital converter therefore has a corresponding error.

To overcome these disadvantages, a method of calculating the input bias current value of the comparator and varying the resistance value of each resistor in consideration of a voltage drop generated by the input bias current has been used. For example, if the resistor $R(2^N)$ has a resistance value R, the resistor $R(2^N-1)$ has a resistance value R−ΔR. Thus, each resistance value is changed so that the value of $I(2^N)R$ is the same as the value of $I(2^N-1)(R-\Delta R)=(I_{MIN}+i_b)(R-\Delta R)$. However, this method requires precise control of the bias current value. If the input bias current of the comparator varies due to variation of a process, etc., the error of the analog-to-digital converter varies correspondingly.

SUMMARY OF THE INVENTION

It is therefore an object of the present invention to provide an analog-to-digital converter which is capable of eliminating error resulting from variations in reference voltage by generating the same current as an input bias current of a comparator independently of process variation and by compensating for the input bias current of the comparator using the generated current.

In accordance with one aspect of the present invention, an analog-to-digital converter includes a reference voltage generator for providing a plurality of reference voltages at each connecting point of a plurality of serially connected resistors, which have the same resistance value. A plurality of comparators each has a reference voltage input terminal connected to one of the reference voltages and an analog signal input terminal for generating a comparative signal by comparing the plurality of reference voltages with an analog input signal on the analog signal input terminal. Each of the comparators has a predetermined input bias current value. A plurality of bias current sources supplies the input bias current to the reference voltage input terminal of the plurality of comparators. In another aspect, a method is provided which compensates for bias current in an analog-to-digital converter of the type having a plurality of emitter-coupled comparators each of which has a reference voltage input terminal and an analog signal input terminal.

BRIEF DESCRIPTION OF THE DRAWINGS

The above object, and other features and advantages of the present invention will be more apparent after a reading of the following detailed description taken in conjunction with the drawings, in which.

DETAILED DESCRIPTION OF THE PREFERRED EMBODIMENT

Figure 5:
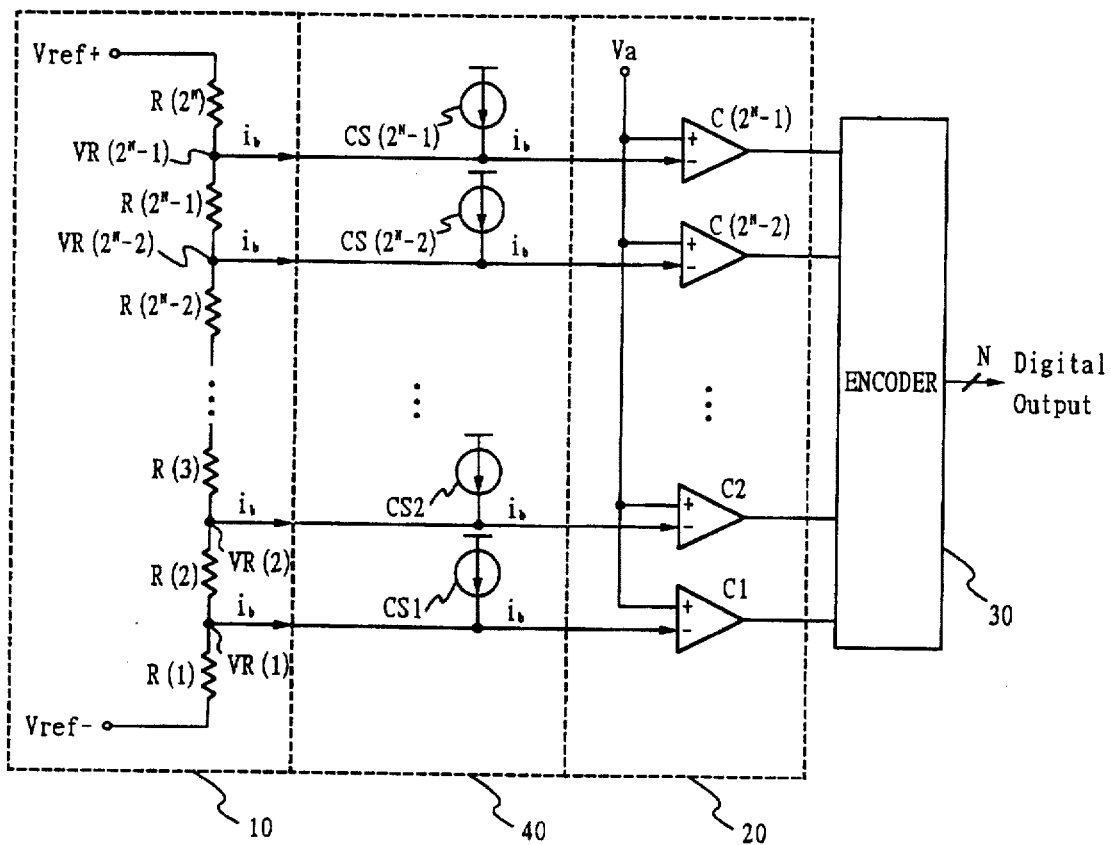
FIG. 5 is a circuit diagram of an analog-to-digital converter in accordance with an embodiment of the present invention.

Hereinafter, an analog-to-digital converter for compensating for input bias current of a comparator will be described with reference to the drawings. In FIG. 5, the same parts as in FIG. 1 are designated by identical reference numerals and the detailed description thereof will be omitted.

Figure 1:
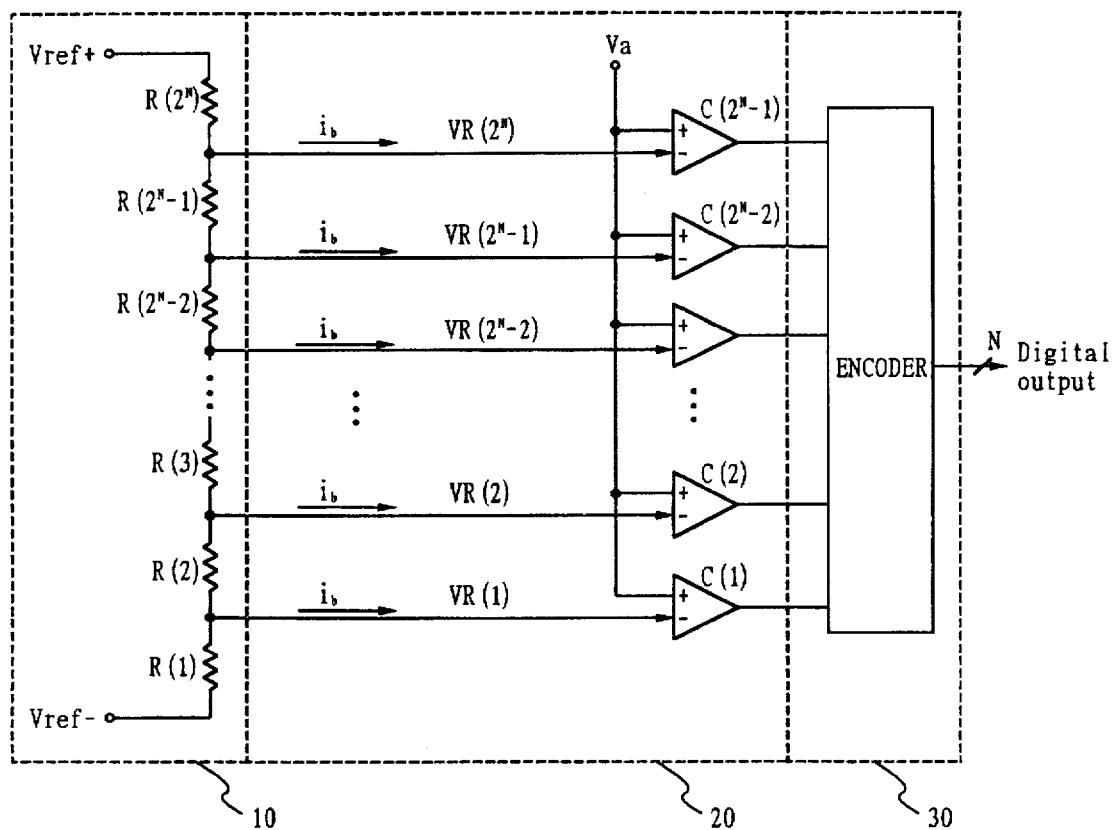
FIG. 1 is a circuit diagram of a conventional analog-to-digital converter.
Figure 2:
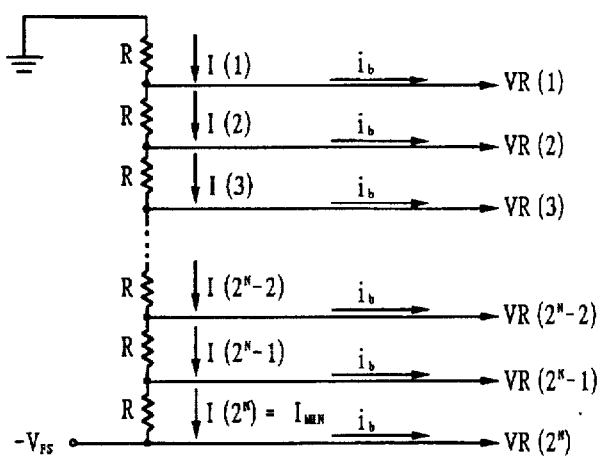
FIG. 2 is an equivalent circuit diagram of a reference voltage generator shown in FIG. 1.
Figure 3:
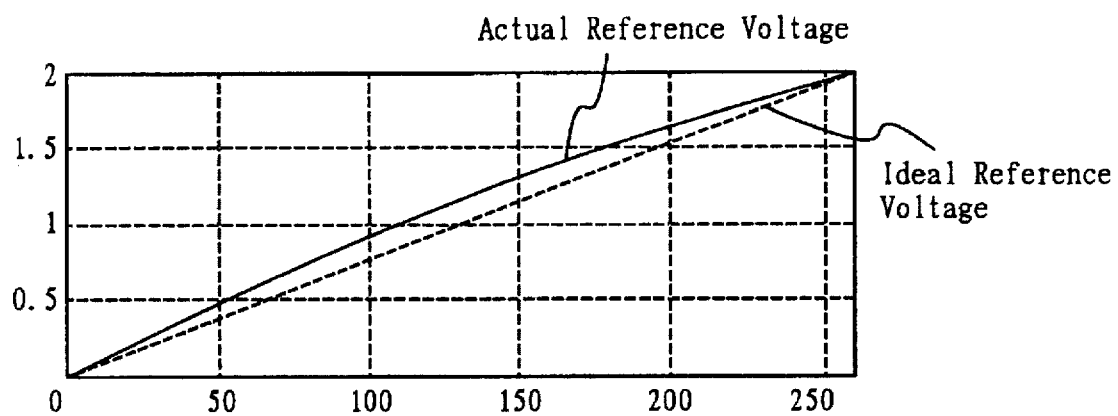
FIGS. 3 and 4 are a reference voltage characteristic graph and a reference voltage error graph of the conventional analog-to-digital converter of FIG. 1.
Figure 4:
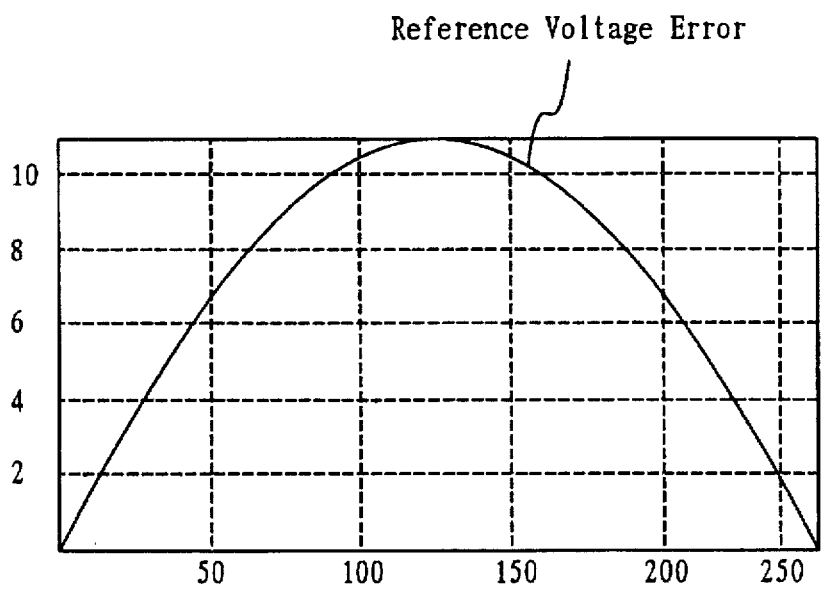

Referring to FIG. 5, a constant current source circuit 40 for generating the same current as an input bias current of each comparator is provided relative to the circuit of FIG. 1.

A plurality of resistors $R(1), R(2), \ldots, R(2^N)$ are serially connected between a first reference voltage Vref+ and a second reference voltage Vref−. A reference voltage generator 10 including the resistors $R(1), \ldots, R(2^N)$ divides a difference voltage $V_{FS}$ between the first and second reference voltages by these resistors and provides a plurality of reference voltages $VR(1), VR(2), \ldots, VR(2^N-1)$ at each connecting point of the serially connected resistors. A comparative circuit 20, including a plurality of emitter-coupled comparators $C1, \ldots, C(2^N-1)$ each having a common-emitter current source with a predetermined current value, has a predetermined input bias current value and generates a comparative signal by comparing the plurality of reference voltages with an analog input signal. An encoder 30 encodes the output of the comparative circuit 20 to digital data. The constant current source circuit 40 having a plurality of constant current sources $CS1, \ldots, CS(2^N-1)$ supplies an input bias current to each reference voltage input terminal, i.e. each (−) input terminal, of the emitter-coupled comparators $C1, \ldots, C(2^N-1)$.

Figure 6:
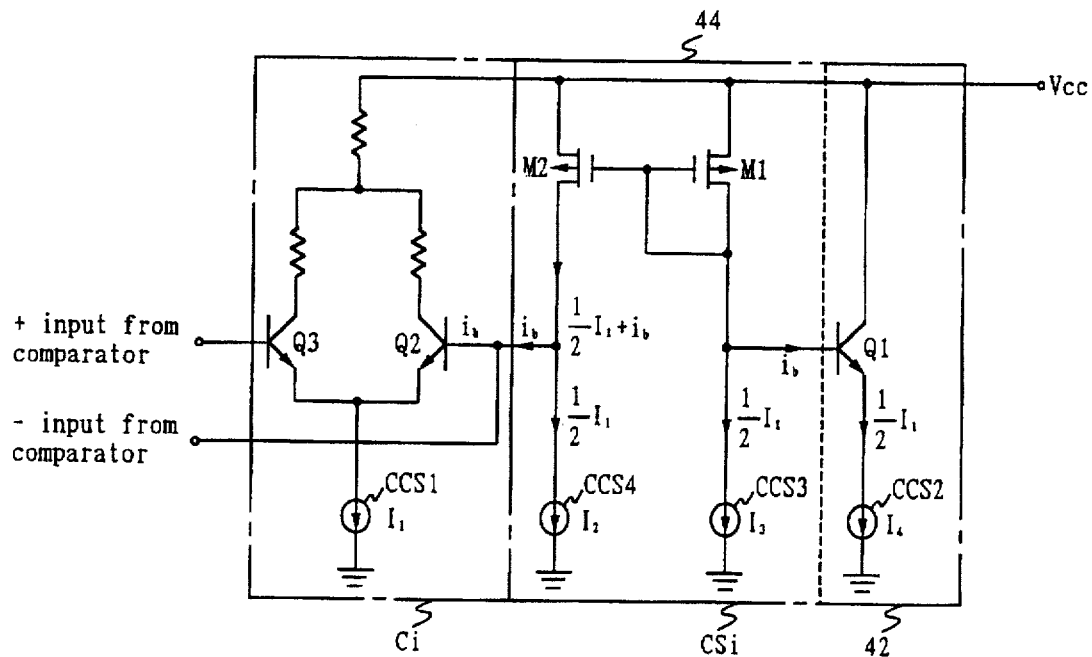
FIG. 6 is a schematic diagram of a constant current source for compensating for an input bias current shown in FIG. 5.

Each constant current source includes, as shown in FIG. 6, a reference current source 42 for providing the same current value as the input bias current of the comparator as a reference current, and a current mirror 44 for supplying the current value of the reference current source 42 to the reference voltage input terminal of the comparator.

The reference current source 42 has a first constant current source CCS2 with a current value set to half the current value of a common-emitter current source CCS1 of the comparator Ci, and a bipolar transistor Q1 with the emitter thereof connected to the first constant current source CCS2, the collector connected to a power voltage Vcc and the base connected to the current mirror 44.

The current mirror 44 has second and third constant current sources CCS3 and CCS4 each with the current value thereof set to half the current value of the common-emitter current source CCS1 of the comparator Ci. Also included in current mirror 44 is a first PMOS transistor M1 with the drain and gate commonly connected to the second constant current source CCS3 and to the reference current source 42 and the source connected to the power voltage Vcc, and a second PMOS transistor M2 with the drain connected to the third constant current source CCS4 and to the reference voltage input terminal of the comparator Ci, the gate being connected to the gate of the fist PMOS transistor M1 and the source to the power voltage Vcc. Q2 and Q3 are input transistors of the comparator Ci.

In operation, assuming that the bias current of an input amplifier stage of the comparator Ci is $I_1$ and a current amplification factor of the input transistor Q2 is β, the input bias current $i_b$ is $$\frac{1}{\beta} \cdot \frac{I_1}{2}.$$

The constant current sources CCS2, CCS3 and CCS4 generate a current of $$\frac{I_1}{2}$$

corresponding to half the current of the common emitter current source CCS1. These current sources may be easily made by using the well-known current mirror, etc. Since the transistors Q1 and Q2 are the same form and their bias currents are also $$\frac{I_1}{2},$$

the base current $i_b$ of the transistor Q1 connected to the current source CCS2 is the same as the base current of the transistor Q2. Therefore, the drain current of the transistor M1 is $+i_b$ and the drain current of the transistor M2 which is connected as a current mirror form with the transistor M1 is also $$\frac{I_1}{2} + i_b.$$

Since the third constant current source CCS4 has a current value of $$\frac{I_1}{2},$$

a difference between the drain current is $$\frac{I_1}{2} + i_b$$

of the transistor M2 and $$\frac{I_1}{2},$$

i.e., $i_b$ flows into the base of the transistor Q2. Consequently, the current $i_b$ is the bias current of the input stage of the comparator and there is no current flow from the reference resistor. Since there is no current flowing into the comparator from the reference resistor, an error at a reference potential does not occur.

As described above, the bias current flowing into the comparator from the reference resistor is compensated by the constant current source. Hence, the input bias current of the comparator can be stably maintained and the reference voltage characteristic can be linearly improved.

Although the present invention has been described and illustrated with reference to a preferred embodiment, it is to be readily understood that the present invention is not limited to the preferred embodiments, and various changes and modifications can be made without departing from the scope and spirit of the invention defined in the appended claims.

What is claimed is:

1. An analog-to-digital converter comprising:
   a reference voltage generator for providing a plurality of reference voltages at each connecting point of a plurality of serially connected resistors, said plurality of resistors having the same resistance value;
   a plurality of comparators each of which has a reference voltage input terminal connected to one of said reference voltages and an analog signal input terminal for generating a comparative signal by comparing said plurality of reference voltages with an analog input signal on said analog signal input terminal, each of said comparators having a predetermined input bias current value; and
   a plurality of bias current sources for supplying said input bias current to said reference voltage input terminal of said plurality of comparators.

2. The analog-to-digital converter of claim 1 wherein said comparators comprise emitter-coupled comparators each of which includes a common emitter current source with a predetermined current value.

3. The analog-to-digital converter of claim 1 wherein each of said plurality of bias current sources comprises:
   a reference current source for supplying the same current as the input bias current of said comparator as a reference current; and
   a current mirror for supplying the same current as said reference current to said reference voltage input terminal of said comparator.

4. An analog-to-digital converter as set forth in claim 3 wherein said comparators comprise emitter-coupled comparators each of which includes a common emitter current source with a predetermined current value and wherein said reference current source comprises:
   a first constant current source having a current value of half the current value of said common-emitter current source of said comparator; and
   a bipolar transistor having an emitter connected to said first constant current source, a collector connected to a power voltage and a base connected to an input of said current mirror.

5. An analog-to-digital converter as set forth in claim 4, wherein said current mirror comprises:
   second and third constant current sources each having a current value of half the current value of said common-emitter current source of said comparator;
   a first PMOS transistor having a drain terminal and a gate terminal commonly connected to said second constant current source and to said reference current source, and having a source terminal connected to a power voltage; and
   a second PMOS transistor having a drain terminal connected to said third constant current source and to said reference voltage input terminal of said comparator, a gate terminal connected to the gate terminal of said first PMOS transistor, and and a source terminal connected to said power voltage.

6. An analog-to-digital converter comprising:
   means for generating a plurality of reference voltages;
   a plurality of comparators each of which has an input bias current;
   a reference voltage input terminal associated with each comparator, said reference voltage input terminals each being connected to a different one of such reference voltages;
   an analog signal input terminal associated with each comparator, said analog signal input terminal receiving an analog signal when said converter is in operative condition; and
   a plurality of bias current sources each of which is associated with one of said analog signal input terminals for supplying said input bias current when said converter is in operative condition.

7. The analog-to-digital converter of claim 6 wherein said means for generating a plurality of reference voltages comprises a plurality of serially connected resistors.

8. The analog-to-digital converter of claim 7 wherein said resistors each have substantially the same resistance.

9. The analog-to-digital converter of claim 6 wherein said comparators comprise emitter-coupled comparators each of which includes a common emitter current source with a predetermined current value.

10. The analog-to-digital converter of claim 6 wherein each of said plurality of bias current sources comprises:

a reference current source for supplying the same current as the input bias current as a reference current; and a current mirror for supplying the same current as said reference current to said reference voltage input terminal of said comparator.

11. An analog-to-digital converter as set forth in claim 10 wherein said comparators comprise emitter-coupled comparators each of which includes a common emitter current source with a predetermined current value and wherein said reference current source comprises:

a first constant current source having a current value of half the current value of said common-emitter current source of said comparator; and a bipolar transistor having an emitter connected to said first constant current source, a collector connected to a power voltage and a base connected to an input of said current mirror.

12. An analog-to-digital converter as set forth in claim 11, wherein said current mirror comprises:

second and third constant current sources each having a current value of half the current value of said common-emitter current source of said comparator;

a first PMOS transistor having a drain terminal and a gate terminal commonly connected to said second constant current source and to said reference current source, and having a source terminal connected to a power voltage; and a second PMOS transistor having a drain terminal connected to said third constant current source and to said reference voltage input terminal of said comparator, a gate terminal connected to the gate terminal of said first PMOS transistor, and a source terminal connected to said power voltage.

13. A method of compensating for bias current in an analog-to-digital converter of the type having a plurality of emitter-coupled comparators each of which has a reference voltage input terminal and an analog signal input terminal, said method comprising the steps of:

generating a plurality of reference voltages;

applying a different reference voltage to each of the reference voltage input terminals;

applying an analog signal to the analog signal input terminals;

generating a plurality of reference currents equal to such bias currents; and supplying each reference current to a corresponding comparator via the reference voltage input terminal.

14. The method of claim 13 wherein supplying each reference current to a corresponding comparator via the reference voltage input terminal comprises mirroring the bias current.

\* \* \* \* \*

UNITED STATES PATENT AND TRADEMARK OFFICE
CERTIFICATE OF CORRECTION

| | |
|---|---|
| PATENT NO. | : 5,721,548 |
| DATED | : February 24, 1998 |
| INVENTOR(S) | : Choe et al. |

It is certified that error appears in the above-identified patent and that said Letters Patent is hereby corrected as shown below:

Column 4,
Line 54, "fist PMOS" should read -- first PMOS --.

Column 6,
Line 47, "and and a source" should read -- and a source --.

Signed and Sealed this

Seventh Day of May, 2002

Attest:

JAMES E. ROGAN
*Attesting Officer*     *Director of the United States Patent and Trademark Office*